(12) United States Patent
Schaller et al.

(10) Patent No.: US 9,899,242 B2
(45) Date of Patent: Feb. 20, 2018

(54) DEVICE AND METHOD FOR SUBSTRATE HEATING DURING TRANSPORT

(71) Applicant: Varian Semiconductor Equipment Associates, Inc., Gloucester, MA (US)

(72) Inventors: Jason M. Schaller, Austin, TX (US); Morgan D. Evans, Manchester, MA (US); Ala Moradian, Beverly, MA (US); Robert Brent Vopat, Austin, TX (US); David Blahnik, Round Rock, TX (US); William T. Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 341 days.

(21) Appl. No.: 14/679,526

(22) Filed: Apr. 6, 2015

(65) Prior Publication Data

US 2016/0293458 A1    Oct. 6, 2016

(51) Int. Cl.
| | | |
|---|---|---|
| *H01L 21/67* | (2006.01) | |
| *H01L 21/324* | (2006.01) | |
| *H01L 27/15* | (2006.01) | |
| *F27B 5/12* | (2006.01) | |
| *F27B 5/14* | (2006.01) | |

(Continued)

(52) U.S. Cl.
CPC .. *H01L 21/67115* (2013.01); *H01L 21/67161* (2013.01); *H01L 21/67196* (2013.01); *F27B 5/12* (2013.01); *F27B 5/14* (2013.01); *F27D 2003/0051* (2013.01)

(58) Field of Classification Search
None
See application file for complete search history.

(56) References Cited

U.S. PATENT DOCUMENTS

| 5,380,682 A | 1/1995 | Edwards et al. |
|---|---|---|
| 5,954,982 A | 9/1999 | Sogard |

(Continued)

FOREIGN PATENT DOCUMENTS

| EP | 1189264 A1 | 3/2002 |
|---|---|---|
| EP | 2458627 A2 | 4/2015 |
| KR | 10-2012-0081023 A | 7/2012 |

OTHER PUBLICATIONS

International Search Report and Written Opinion dated Jun. 21, 2016 in corresponding PCT application No. PCT/US2016/023537.

(Continued)

*Primary Examiner* — Joseph M Pelham
(74) *Attorney, Agent, or Firm* — Nields, Lemack & Frame, LLC

(57) ABSTRACT

A system for heating substrates while being transported between processing chambers is disclosed. The system comprises an array of light emitting diodes (LEDs) disposed in the transfer chamber. The LEDs may be GaN LEDs, which emit light at a wavelength which is readily absorbed by silicon, thus efficiently and quickly heating the substrate. A controller is in communication with the LEDs. The LEDs may be independently controllable, so that the LEDs that are disposed above the substrate as it is moved from one processing chamber to another are illuminated. In other words, the illumination of the LEDs and the movements of the substrate handling robot may be synchronized by the controller.

19 Claims, 8 Drawing Sheets

(51) Int. Cl.
*F27D 3/12* (2006.01)
*F27D 3/00* (2006.01)

(56) References Cited

U.S. PATENT DOCUMENTS

| | | | |
|---|---|---|---|
| 6,818,864 B2 | 11/2004 | Ptak | |
| 8,107,801 B2 | 1/2012 | Shimizu et al. | |
| 8,328,494 B2 | 12/2012 | Fish et al. | |
| 8,404,499 B2 | 3/2013 | Moffatt | |
| 2003/0045098 A1* | 3/2003 | Verhaverbeke | H01L 21/67069 |
| | | | 438/689 |
| 2005/0016687 A1 | 1/2005 | Shinriki et al. | |
| 2006/0018639 A1 | 1/2006 | Ramamurthy et al. | |
| 2010/0111650 A1 | 5/2010 | Quach et al. | |
| 2012/0057856 A1* | 3/2012 | Rowan | H01J 37/18 |
| | | | 392/416 |
| 2015/0086302 A1 | 3/2015 | Senzaki et al. | |
| 2016/0329458 A1* | 11/2016 | Evans | F26B 3/30 |

OTHER PUBLICATIONS

Morgan D. Evans, Dynamic Heating Method and System for Wafer Processing, U.S. Appl. No. 14/575,591, filed Dec. 18, 2014.

\* cited by examiner

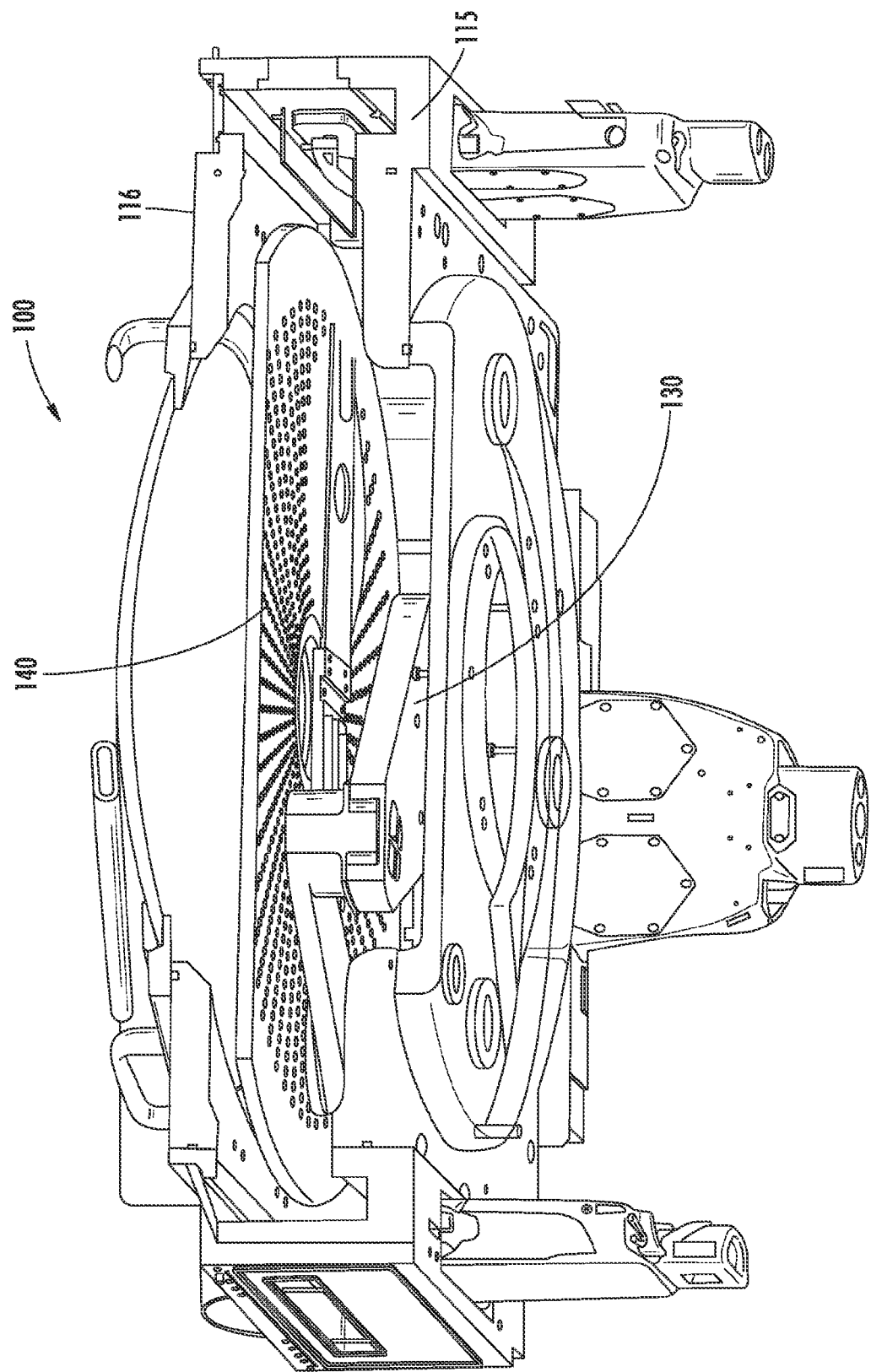

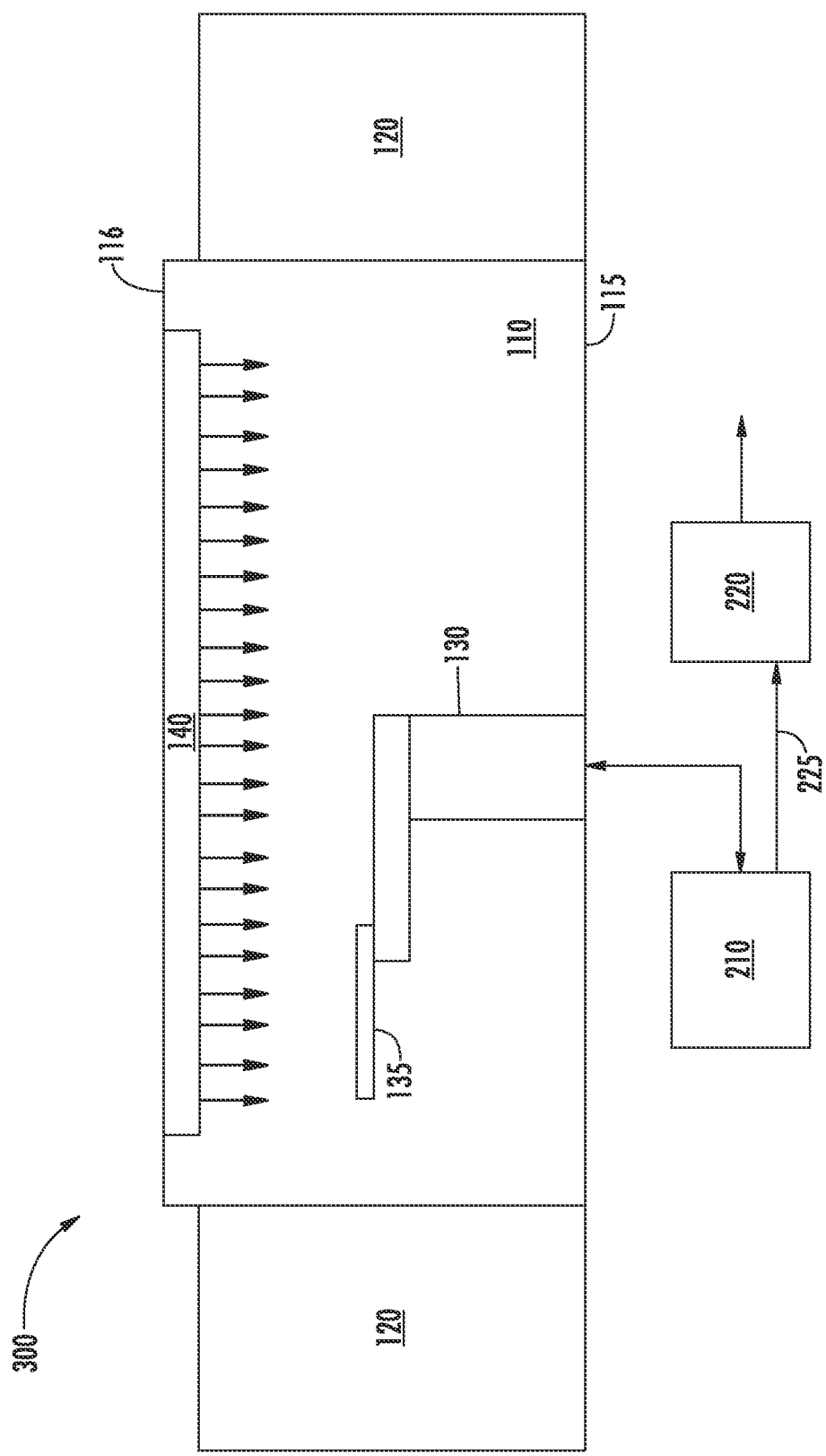

DEVICE AND METHOD FOR SUBSTRATE HEATING DURING TRANSPORT

FIELD

Embodiments of the present disclosure relate to apparatus for heating a substrate during transport, and more particularly, for heating a substrate in a transfer chamber while moving the substrate between processing chambers.

BACKGROUND

The fabrication of a semiconductor device involves a plurality of discrete and complex processes. The semiconductor substrate typically undergoes many processes during the fabrication process. These processes may occur in different processing chambers, which may be maintained at different processing conditions. In certain embodiments, a transfer chamber is used to transport the substrates between these processing chambers. A substrate handling robot is disposed in the transfer chamber and moves the substrate from one processing chamber to another processing chamber. Additionally, the substrate handling robot may move the substrates to and from a load lock, which separates the transfer chamber from the external environment.

Heating substrates before and/or after processing is common in many semiconductor fabrication processes. In many cases, the substrate is heated to a temperature close to the process temperature and then transported to the processing chamber. This preheating may help prevent substrate warping, popping and movement when the cold substrate contacts the hot platen. These phenomenon may cause the creation of particles and mishandling, and may reduce overall process yield.

Additionally, in some embodiments, a substrate may be warmed after being subjected to a cold process to eliminate the possibility of condensation when the substrate exits the transfer chamber.

In many embodiments, this heating of the substrate is performed using a preheating station. The preheating station may comprise one or more infrared lamps that are focused on the substrate. While the preheating station is effective at raising the temperature of the substrate, it has a negative impact on throughput. Specifically, a substrate may be deposited at the preheating station for a significant amount of time in order for the substrate to reach the desired temperature. This increases the time that the substrate remains in the transfer chamber. Further, once the substrate is removed from the preheating station, it begins to cool. For example, in some instances, the substrate may cool up to 50° C. or more as it is being transported from the preheating station to the processing chamber. Thus, the substrate may not be at the desired temperature when the substrate is finally placed in that processing chamber.

Therefore, it would be beneficial if there were a system and method of heating a substrate while the substrate is being transported between processing chambers. Further, it would be beneficial if this heating could be accomplished without adding additional processing time to the fabrication process.

SUMMARY

A system for heating substrates while being transported between processing chambers is disclosed. The system comprises an array of light emitting diodes (LEDs) disposed in the transfer chamber. The LEDs may be GaN LEDs, which emit light at a wavelength which is readily absorbed by silicon, thus efficiently and quickly heating the substrate. A controller is in communication with the LEDs. The LEDs may be independently controllable, so that the LEDs that are disposed above the substrate as it is moved from one processing chamber to another are illuminated. In other words, the illumination of the LEDs and the movements of the substrate handling robot may be synchronized by the controller.

In one embodiment, a substrate handling and heating system is disclosed. The substrate handling and heating system comprises a chamber housing, defining a chamber; a substrate handling robot disposed in the chamber; and a LED array, comprising a plurality of LEDs, disposed within the chamber, wherein the LED array is disposed between a top surface of the chamber housing and the substrate handling robot; wherein illumination of the LEDs in the LED array is dependent upon a path of a substrate traveling through the chamber. In some embodiments, the chamber is a transfer chamber. In some embodiments, the LEDs in the LED array disposed above the substrate are illuminated as the substrate travels through the chamber.

In another embodiment, a substrate handling and heating system is disclosed. The substrate handling and heating system comprises a transfer chamber housing, defining a transfer chamber; a substrate handling robot disposed in the transfer chamber; a LED array, comprising a plurality of LEDs, disposed in the transfer chamber, wherein the LED array is disposed between a top surface of the transfer chamber housing and the substrate handling robot; and a controller in communication with the substrate handling robot and the LED array, such that the controller controls movement of the substrate handling robot and controls illumination of the LEDs in the LED array based on a path of a substrate traveling through the transfer chamber via the substrate handling robot. In certain embodiments, the LED array comprises a plurality of zones, where each zone can be independently controlled by the controller. In certain embodiments, the controller illuminates zones disposed above the substrate and turns off zones not disposed above the substrate as the substrate moves along the path.

In another embodiment, a substrate handling and heating system is disclosed. The substrate handling and heating system comprises a transfer chamber housing, defining a transfer chamber; a substrate handling robot disposed in the transfer chamber; a LED array, comprising a plurality of LEDs, disposed in the transfer chamber, wherein the LED array is disposed between a top surface of the transfer chamber housing and the substrate handling robot; a substrate handling controller in communication with the substrate handling robot, such that the substrate handling controller controls movement of the substrate handling robot; and a LED array controller in communication with the LED array, such that the LED array controller controls illumination of the LEDs in the LED array based on a path of a substrate traveling through the transfer chamber via the substrate handling robot. In certain embodiments, the substrate handling robot comprises one or more encoders to provide information about a position of an arm of the substrate handling robot, and the LED array controller receives the information from the encoders. In certain embodiments, the substrate handling controller provides information to the LED array controller about the position or movement of an arm of the substrate handling robot.

BRIEF DESCRIPTION OF THE FIGURES

For a better understanding of the present disclosure, reference is made to the accompanying drawings, which are incorporated herein by reference and in which:

FIGS. 2A-2B are a top view and a cross-sectional view, respectively, of the substrate handling and heating system;

FIG. 5 is a side view of a substrate handling and heating system according to a third embodiment.

DETAILED DESCRIPTION

As described above, in many applications, it is advantageous to preheat a substrate prior to that substrate being processed. Therefore, a system that can be used to heat substrates while the substrates are being transported between processing chambers would be beneficial.

A transfer chamber is used to move, or transport, substrates between processing chambers. In this disclosure, the term "processing chamber" is used to describe any source or destination for a substrate. For example, a processing chamber may be used to perform a particular process, such as implantation, deposition, etching, or annealing. Additionally, the term "processing chamber" also refers to a load lock, which is used to transfer substrates between the transfer chamber and the external environment. A load lock typically comprises a sealable chamber, having two points of access. A substrate may be placed in a load lock by opening one of these points of access and placing the substrate in the sealable chamber. The sealable chamber is then pumped down to near vacuum conditions. The second point of access is then opened, and the substrate is removed, typically by a substrate handling robot disposed in the transfer chamber. The process operates in the reverse manner for substrates leaving the transfer chamber.

Figure 1:
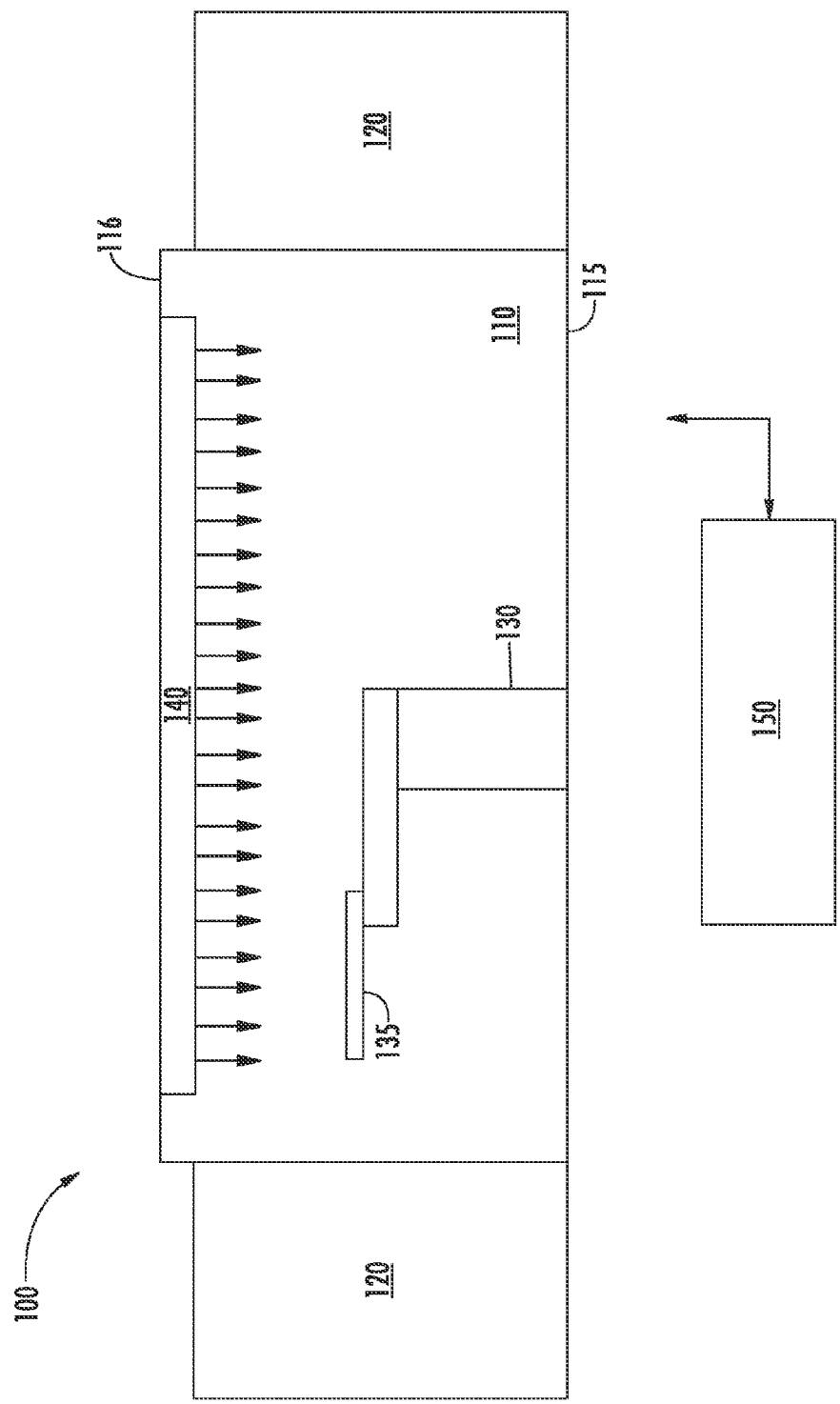
FIG. 1 is a side view of a system used to heat substrates during transport according to one embodiment.

FIG. 1 shows a side view of the substrate handling and heating system 100 according to one embodiment. The substrate handling and heating system 100 comprises a transfer chamber 110, which is in communication with a plurality of processing chambers 120. As described above, the processing chambers 120 may be chambers in which a process, such as implantation, etching, annealing or deposition, is performed. Additionally, the processing chambers 120 may include load locks, used to move substrates between the transfer chamber 110 and the external environment.

The transfer chamber 110 may be defined by a transfer chamber housing 115. Disposed within the transfer chamber 110 is a substrate handling robot 130, which is used to move substrates from any of the processing chambers 120 to any other processing chamber 120. In some embodiments, the substrate handling robot 130 may be disposed such that the arm 135 of the substrate handling robot 130 may access all of the processing chambers 120. In other embodiments, multiple substrate handling robots 130 may be disposed within a transfer chamber 110, such that at least one of the substrate handling robots 130 is able to access each of the processing chambers 120.

The substrate handling robot 130 may be any suitable device. The device may be a SCARA (Selective Compliance Articulated Robot Arm) device, a delta robot, a linear robot or a gantry robot. The arm 135 of the substrate handling robot 130 is used to carry the substrate from one processing chamber 120 to another processing chamber 120. Typically, the top surface of the substrate is not covered as the substrate is being transported by the arm 135.

The transfer chamber 110 may be maintained at near vacuum conditions. The temperature within the transfer chamber 110 may similar to the ambient temperature of the external environment. Other pressure and temperature conditions may also be employed.

An LED array 140 may be disposed within the transfer chamber 110, and located on or near the top surface 116 of the transfer chamber housing 115. In certain embodiments, the LED array 140 is affixed to the top surface 116 of the transfer chamber housing 115, as shown in FIG. 1. In other embodiments, the LED array 140 may be disposed near the top surface 116. In either embodiment, the LED array 140 may be disposed above the substrate handling robot 130, such that the arm 135 of the substrate handling robot 130, and therefore the substrate, is beneath the LED array 140.

The LED array 140 may comprise a plurality of high power LEDs, which emit light of a wavelength or a plurality of wavelengths that is readily absorbed by the substrates. For example, silicon exhibits high absorptivity and low transmissivity in the range of wavelengths between about 0.4 and 1.0 μm. Silicon absorbs more than 50% of the energy emitted in the range of wavelengths from 0.4 to 1.0 μm. LEDs that emit light in this range of wavelengths may be used. In certain embodiments, LEDs made from GaN are employed. These GaN LEDs emit light at a wavelength of about 450 nm.

The LEDs which make up the LED array 140 may be varied in size. In certain embodiments, each LED may be 1.3 mm×1.7 mm. In another embodiment, each LED may be 1 mm×1 mm. Of course, LEDs of other dimensions are also within the scope of the disclosure. The density of the LEDs in the LED array 140 may vary. For example, in one embodiment, a density of 8.65 LEDs/cm$^2$ may be used. In another embodiment, a density of 18.1 LEDs/cm$^2$ may be used. In other embodiments, densities of up to 78 LEDs/cm$^2$ may be used. As such, the density of the LED array 140 is not limited by the disclosure.

The LED array 140 may cover the entirety of the top surface 116 of the transfer chamber housing 115 in some embodiments. Thus, depending on the density of the LED array 140, more than 35,000 individual LEDs may be used to create the LED array 140. In other embodiments, the LED array 140 may cover a portion of the top surface 116.

These LEDs may be grouped into zones. A zone is defined as a set of LEDs that is commonly controlled, such that all LEDs in that zone illuminate and turn off as a single entity. In certain embodiments, each zone may comprise hundreds or even thousands of LEDs. However, in another embodiment, each zone comprises a smaller number of LEDs. For example, in one embodiment, each zone comprises a single LED so that each LED in the LED array 140 may be individually controlled. Further, the number of LEDs in a zone is not limited by this disclosure. Additionally, while zones may all be of equal area, this is not the only embodiment. For example, each zone may not have the same number of LEDs or cover the same area.

The substrate handling robot 130 and the LED array 140 may each be in communication with a controller 150. While FIG. 1 shows a single controller 150, it is understood that each of these devices may have a dedicated controller.

The controller 150 may have output or control signals that instruct the substrate handling robot 130 from which processing chamber 120 the next substrate may be retrieved (i.e. the source processing chamber), and to which processing chamber 120 that next substrate is to be transported (i.e. the destination processing chamber). In certain embodiments, the controller 150 may provide control signals specifying each movement of the substrate handling robot 130 as the arm 135 moves from the source processing chamber to the destination processing chamber. In other embodiments, the substrate handling robot 130 may have an internal control unit, with a memory element in which the path from any processing chamber to any other processing chamber is defined and stored. In this embodiment, the controller 150 simply stipulates the source processing chamber and the destination processing chamber, and the substrate handling robot 130 executes the requisite movements. In some embodiments, the controller 150 may also provide a time parameter to the substrate handling robot 130, which informs the substrate handling robot 130 when to execute the given movements. However, other embodiments are also possible. For example, the controller 150 may provide control signals that correspond to each motion that the arm 135 of the substrate handling robot 130 is to perform. The granularity of these motions may vary. For example, in one embodiment, the controller 150 may dictate motions as rotary or linear, defined by a radius and arc, for rotary motions, and by length and direction, for linear motions. The control signals may be encoded in other ways as well. However, in all embodiments, the controller 150, either directly or indirectly, controls the movement of the substrate handling robot 130 and the time when this movement occurs.

The controller 150 may also be in communication with the LED array 140. The controller 150 may provide control or output signals to the LED array 140 to illuminate and turn off particular zones. In certain embodiments, LEDs, unlike halogen lamps, may reach full illumination in about 200 ms. Thus, the LEDs of the LED array 140 may be easier to turn on and off than conventional heating lamps.

In certain embodiments, a dedicated lighting controller may be provided with the LED array 140, such that the controller 150 simply provides a zone number, or a plurality of zone numbers, and an action to be performed in that zone or zones. The controller 150 may also provide a time parameter, indicating when the action is to be performed. In yet another embodiment, the dedicated lighting controller include a memory element, which contains a set of preset patterns, where each pattern represents the path and zones between any source processing chamber and any destination processing chamber. In this embodiment, the controller 150 may simply provide the dedicated lighting controller with the source processing chamber and the destination processing chamber. In some embodiments, the controller 150 may also provide a time parameter to the dedicated lighting controller, which informs the dedicated lighting controller when to execute the given sequence.

In other embodiments, a dedicated lighting controller may not be used. In this embodiment, the controller 150 may have an output signal for each of the zones of the LED array 140, such that assertion of an output signal illuminates all of the LEDs in the corresponding zone. Other embodiments are also possible. However, in all embodiments, the controller 150, either directly or indirectly, controls the illumination of the LEDs in the LED array 140 and the time when this illumination occurs.

As stated above, in certain embodiments, one controller 150 is used to control both the substrate handling robot 130 and the LED array 140. In this embodiment, the controller 150 has knowledge of the movements that the substrate handling robot 130 will take, as the controller 150 is providing the instructions to the substrate handling robot 130 for that movement. Thus, in this embodiment, the controller 150 uses this information about the forthcoming movements of the substrate handling robot 130 to illuminate particular zones of the LED array 140.

In all of the embodiments described herein, the zones illuminated by the controller 150 may be dependent upon the path the substrate travels from the source processing chamber to the destination processing chamber. By illuminating zones as the substrate travels along a path in the transfer chamber, the substrate may be heated. For example, the controller 150 may actuate the zone in the LED array 140 directly above the substrate as the substrate handling robot 130 moves the substrate from the source processing chamber to the destination processing chamber. This illumination sequence may have several advantages. First, it minimizes the power used to heat the substrate, as only the LEDs that are disposed above the substrate, and are therefore capable of effectively heating it, are used. Second, by only illuminating a portion of the LED array, the heat that is generated within the transfer chamber 110 is reduced. This may allow the substrate handling robot 130 to remain at a cooler temperature than would be achievable if the LEDS were all used at once.

Figure 2A:
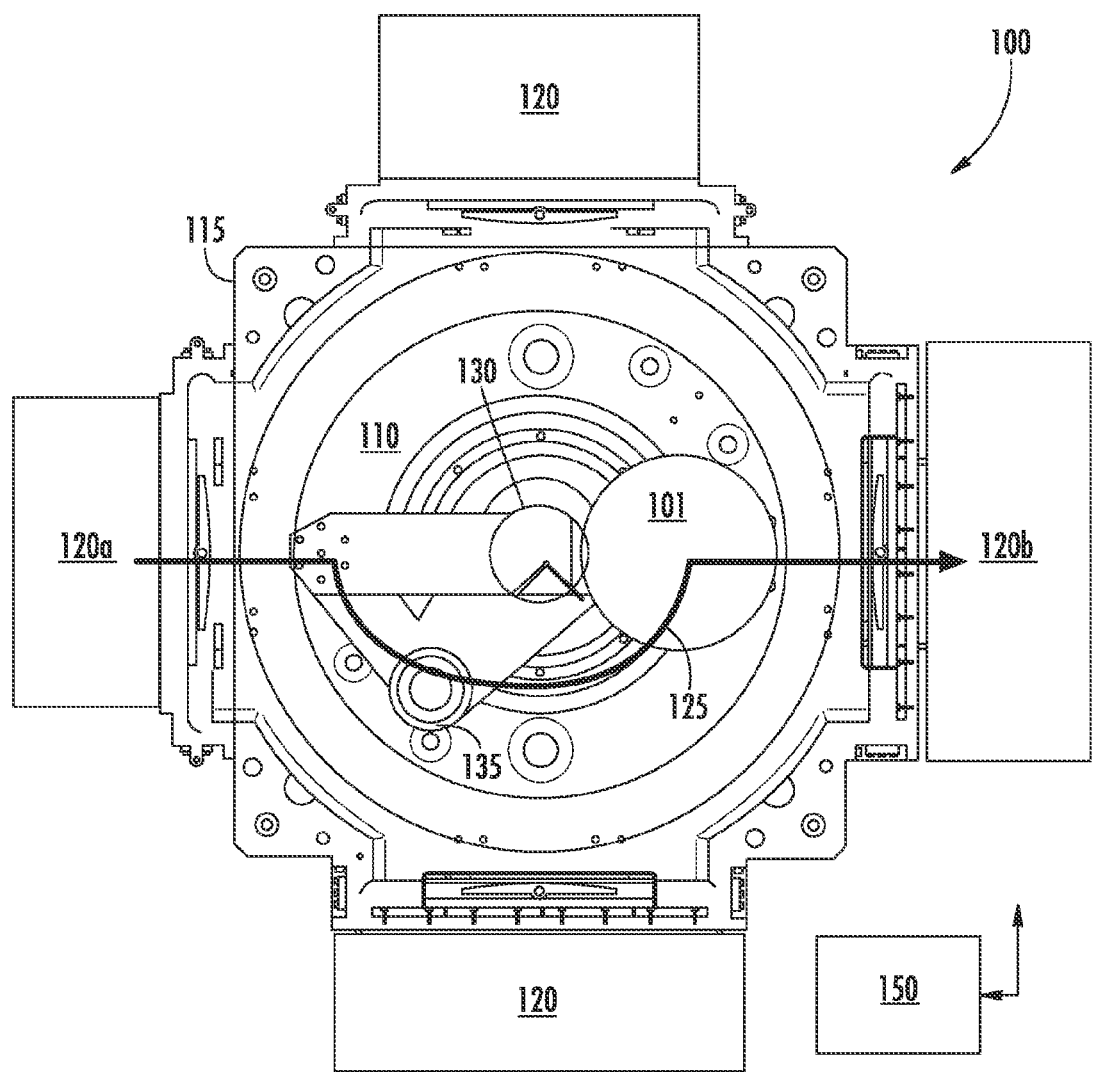

FIG. 2A shows a top view of the substrate handling and heating system 100, showing the substrate handling robot 130, the arm 135, the transfer chamber 110 and the substrate 101. FIG. 2B shows a cross-sectional view of the substrate handling and heating system 100, which shows the relative positions of the substrate handling robot 130, the transfer chamber housing 115 and the LED array 140.

In this example, a substrate 101 is moved from a source processing chamber 120a disposed on the left side of the transfer chamber 110 to a destination processing chamber 120b disposed on the right side of the transfer chamber 110. Path 125 represents the path taken by the substrate 101 moving from the source processing chamber 120a to the destination processing chamber 120b. While path 125 shows the path including an arced portion enveloped by linear portions, other embodiments are also possible and the disclosure is not limited to any particular path. Further, other paths are also possible. For example, substrates may be moved from any of the processing chambers 120 to any other of the processing chambers 120. Thus, path 125 is simply representative of one possible path that a substrate 101 may travel within the transfer chamber 110.

As described above, the controller 150 may instruct the substrate handling robot 130, using control signals, to move a substrate 101 from source processing chamber 120a to destination processing chamber 120b. The controller 150, or the internal control unit of the substrate handling robot 130, may determine the path 125 that will be traversed by the substrate 101 as it is moved. In either embodiment, the controller 150 is aware of the path 125 taken by the substrate 101. The controller 150 also instructs the LED array 140 to illuminate the LEDs in the LED array 140 that are along the path 125. In other words, in one embodiment, all of the zones that are above path 125 are illuminated at once, and the substrate 101 is moved along the path 125. In another embodiment, the zones of LEDs may be illuminated only when the substrate 101 is disposed or about to be disposed directly below that zone. In other words, the zone located near the source processing chamber 120a may be illuminated first. As the substrate 101 moves to the right, that zone may be turned off, while a second zone is illuminated. This process may continue for as many zones are involved in the path 125. In certain embodiments, the LEDs for the second zone may be illuminated prior to turning off the LEDs in the first zone.

Further, in certain embodiments, the LEDs of the LED array 140 are illuminated such that all portions of the substrate 101 are equally lit while it is moving between the source processing chamber 120*a* and the destination processing chamber 120*b*. In other words, in certain embodiments, the entire substrate 101 is lit as the substrate 101 travels along the path 125.

In other embodiments, all portions of the substrate 101 are equally lit; however, the substrate 101 is not illuminated throughout the entire path 125. For example, the substrate 101 may be not illuminated when it first exits the source processing chamber or as it enters the destination processing chamber. For example, the LED array 140 may only be used to illuminate the substrate 101 during the arced portion of the path 125. However, in certain embodiments, during those portions of the path 125 where the substrate 101 is illuminated, all portions of the substrate are equally lit.

FIG. 2A shows a transfer chamber 110 in communication with four processing chambers. However, the disclosure is not limited to this embodiment. For example, the transfer chamber may have five, six, eight or any other suitable number of processing chambers. As described above, in some embodiments, a plurality of substrate handling robots 130 is disposed within the transfer chamber 110, such that at least one substrate handling robot 130 may communicate with each processing chamber. The substrate handling robots may also be capable of communicating with each other to transfer the substrate 101 from one substrate handling robot to another.

Figure 3A:
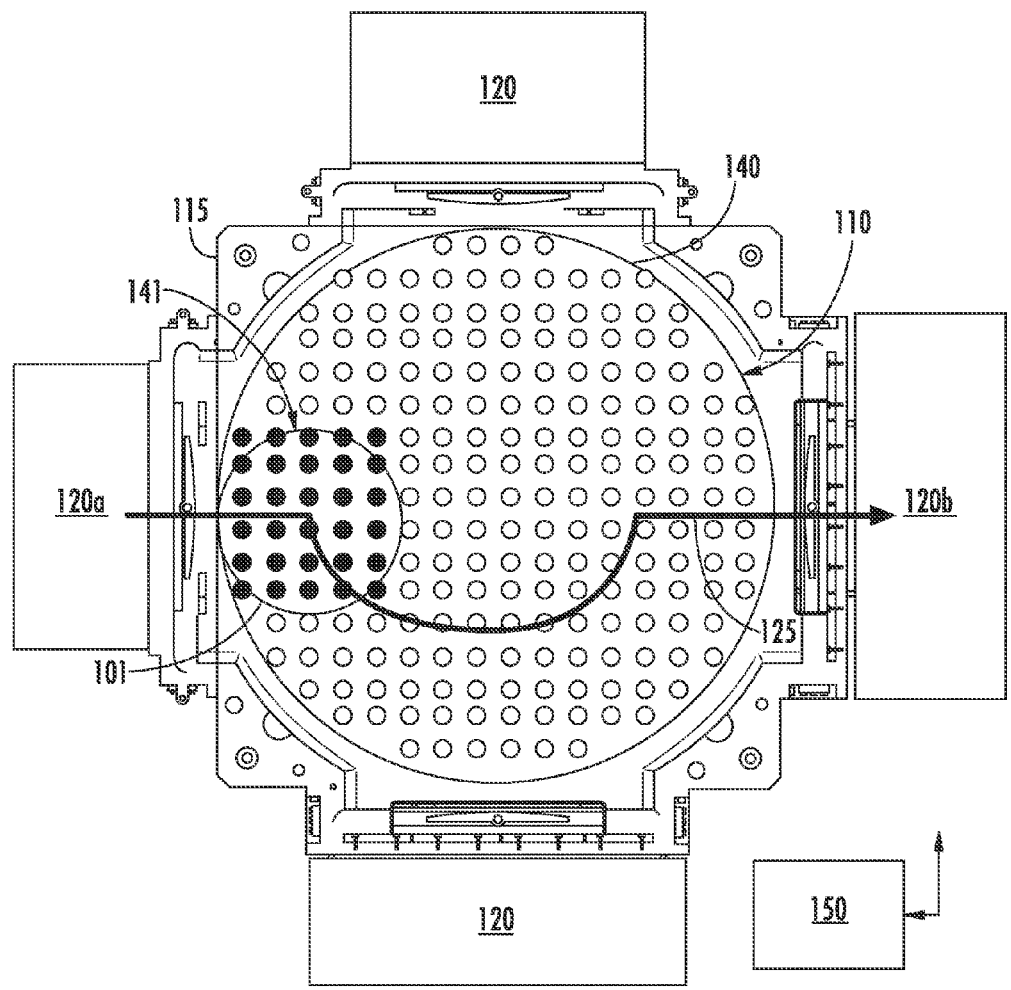
FIGS. 3A-3C show an embodiment of the operation of the LED array.
Figure 3B:
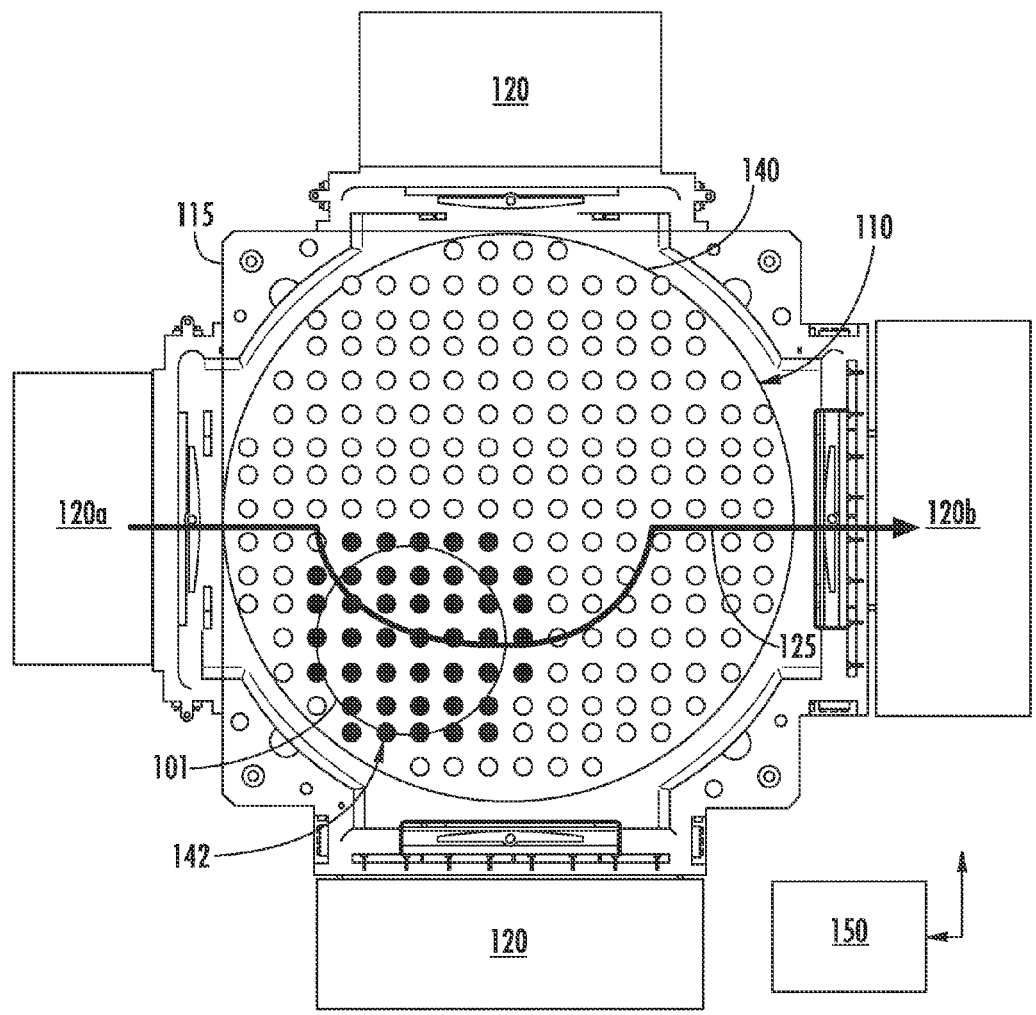
Figure 3C:
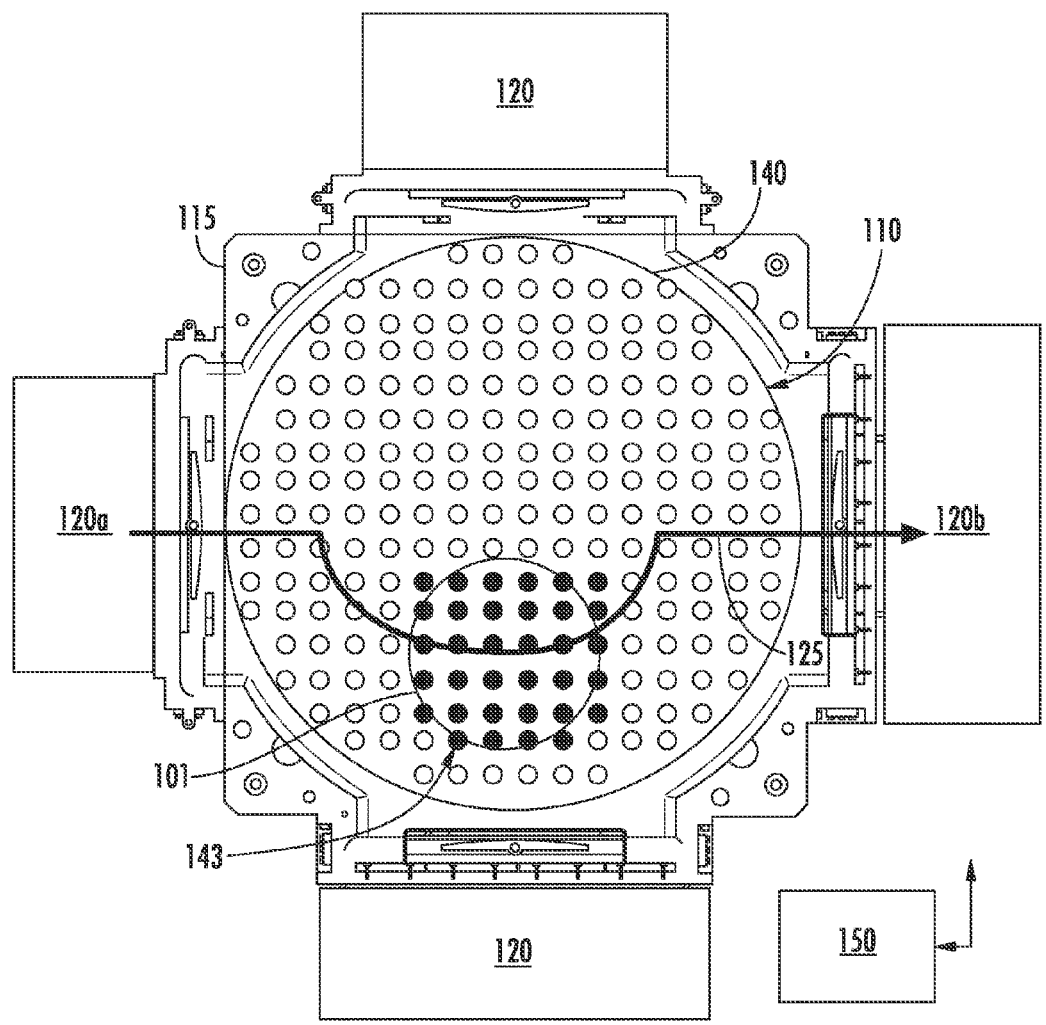

FIGS. 3A-3C represent one embodiment of the operation of the LED array 140. In these figures, the LEDs of the LED array 140 are shown. However, for clarity, the arm 135 and the substrate handling robot 130 are not illustrated. However, these components are part of this embodiment.

In FIG. 3A, the substrate 101 has just exited the source processing chamber 120*a* and entered the transfer chamber 110. A subset 141 of the LED array 140, shown in solid fill, is illuminated at this time. The subset 141 of LEDs may represent one zone, a plurality of zones, or may represent a plurality of individual LEDs. In other words, the size of each zone is not limited by this example or by this disclosure. The subset 141 of LEDs may be selected based on their ability to effectively heat the substrate 101. In other words, LEDs that are disposed a distance away from the substrate 101 may not effectively heat the substrate 101, therefore, these LEDs may not be illuminated. In certain embodiments, the subset of LEDs that are disposed directly above the substrate 101 are illuminated.

As the substrate continues moving along path 125, it reaches the position shown in FIG. 3B. In this location, a second subset 142 of the LED array 140 is illuminated. In certain embodiments, some of the LEDs that were part of subset 141 are also part of second subset 142. For example, subset 141 may comprise a plurality of zones, where at least one of those zones is also part of second subset 142. This helps insure that all portions of the substrate 101 remain equally illuminated while the substrate 101 is being transported from the source processing chamber 120*a* to the destination processing chamber 120*b*. FIG. 3C shows the substrate 101 as it continues along path 125. In this position, a third subset 143 of LEDs in the LED array 140 are illuminated. In this location, all of the LEDs that were part of subset 141 are now turned off, as the substrate 101 has left the portion of the transfer chamber 110 where the LEDs in subset 141 will effectively illuminate and heat the substrate 101. However, some of the LEDs that were part of second subset 142 may also be part of third subset 143.

Thus, as described above, in certain embodiments, the LEDs that comprise the LED array 140 are controlled in such a way so that the LEDs that are above the substrate 101 at a particular point in time are illuminated. As the substrate 101 moves beyond a particular LED or zone of LEDs, that LED or zone of LEDs is turned off. Thus, the position of the substrate can be defined by Cartesian coordinates (x,y) or by polar coordinates (r,θ) and by a time parameter. The illumination of LEDs, subsets of LEDs or zones of LEDs is related to the position of the substrate at a particular point in time.

Figure 4:
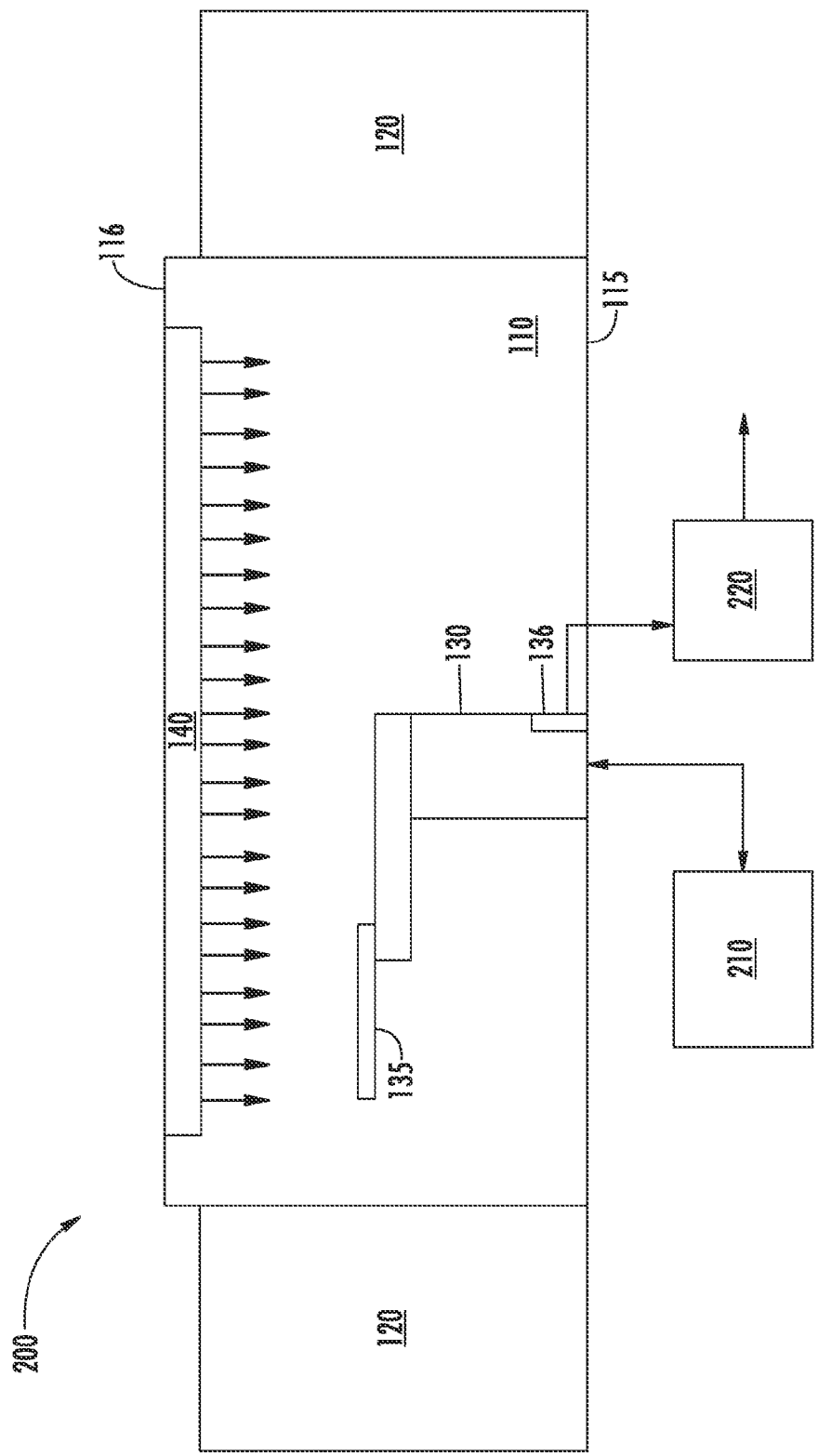
FIG. 4 is a side view of a substrate handling and heating system according to another embodiment.

The embodiment of FIG. 1 assumes a controller 150 that is aware of, and in communication with, both the substrate handling robot 130 and the LED array 140. However, other embodiments are also possible. FIG. 4 shows another embodiment. In this embodiment, many of the same components are present and are given identical reference designators. Therefore, these components will not be described again. In this embodiment, the substrate handling and heating system 200 includes a substrate handling controller 210 that controls the movements of the substrate handling robot 130. The substrate handling and heating system 200 also includes an LED array controller 220, which controls the LEDs in the LED array 140.

This embodiment does not include a controller that is both aware of the motion of the substrate handling robot 130 and can control the LED array 140. In this embodiment, the substrate handling controller 210 provides control signals or outputs to the substrate handling robot 130, as was described above with respect to controller 150. As described above, these control signals or outputs may be used to specify a source processing chamber, a destination processing chamber and a time parameter. In other embodiments, the control signals or outputs may instruct the arm 135 of the substrate handling robot 130 of the movements to execute and when these movements are to be performed.

LED array controller 220 provides control signals or outputs to the LED array 140 as was described above with respect to controller 150. The LED array controller 220 may specify the zones to be illuminated and the time to perform that illumination. In other embodiments, the LED array controller 220 provides control signals to actuate each zone directly.

However, in this embodiment, unlike that of FIG. 1, information regarding the motions of substrate handling robot 130 is passed to the LED array controller 220. In certain embodiments, the substrate handling robot 130 may have one or more encoders 136, which provide information regarding the position of the arm 135 of the substrate handling robot 130. The information from these encoders 136 is passed to the LED array controller 220. Using the information regarding the position of the arm 135 of the substrate handling robot 130, the LED array controller 220 is able to illuminate the appropriate LEDs or zones of LEDs, as described above. For example, the LED array controller 220 may include a memory element that contains a mapping of the encoder position of the arm 135 to zones or zones of the LED array 140. In another embodiment, the LED array controller 220 may execute an algorithm to determine the appropriate zones based on the encoder information.

Thus, in this embodiment, the LED array controller 220 uses actual position information regarding the substrate handling robot 130 to determine which zones of LEDs should be illuminated at a particular time.

Like FIG. 4, FIG. 5 shows an embodiment of a substrate handling and heating system 300 having a substrate handling controller 210 and a LED array controller 220. However, in this embodiment, the substrate handling controller 210 has an output, or set of outputs, which communicate with the LED array controller 220. In other words, in certain embodiments, the substrate handling controller 210 informs the LED array controller 220 of actions that the substrate handling robot 130 is or will be executing. In other embodiments, the substrate handling controller 210 informs the LED array controller 220 of the position of the arm 135 of the substrate handling robot.

In certain embodiments, the connection 225 between the two controllers may be unidirectional, where the substrate handling controller 210 communicates to the LED array controller 220. In other embodiments, this connection may be bidirectional, such as a network connection. Based on this information from the substrate handling controller 210, the LED array controller 220 is able to control the LED array 140 in the manner described above. Thus, in certain embodiments, the substrate handling controller 210 communicates with the LED array controller 220 to provide the LED array controller 220 with the information in order to properly orchestrate the illumination of the LED array 140.

The embodiments described above in the present application may have many advantages. First, the use of multiple LEDs in an LED array allows finer granularity over the areas of the transfer chamber 110 that are illuminated. In particular, it is possible to illuminate only those LEDs that are above the substrate. In this way, the substrate is heated by the LEDs, but excessive heat is not introduced into the transfer chamber.

Additionally, the finer granularity allows all portions or regions of the substrate to be equally illuminated. This minimizes thermal stress on the substrate. In other words, in certain embodiments, all portions of the substrate are illuminated as it moved along its path from a source processing chamber to a destination processing chamber.

Further, the use of LEDs may be an efficient way to heat the substrate. In certain embodiments, the substrate can be heated to the intended temperature during its path from the source processing chamber to the destination processing chamber, without using a preheat station, or slowing or stopping along the path. This may improve efficiency and throughput.

Further, the use of LEDs also reduces the heat that is introduced into the transfer chamber and also reduces the total power needed. The light from the LEDs is used to heat the substrate, due to the coupling with the substrate material and the wavelength of the light emitted from the LED. This is in contrast to infrared or halogen lamps, which generate a great deal of heat and emit light at a wavelength which is not absorbed by the substrate. Additionally, the selective illumination of the LEDs may reduce the heat that is transferred to the substrate handling robot 130, which may contain heat-sensitive components.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A substrate handling and heating system, comprising:
a chamber housing, defining a chamber;
a substrate handling robot disposed in the chamber; and
a LED array, comprising a plurality of LEDs, disposed within the chamber, wherein the LED array is disposed between a top surface of the chamber housing and the substrate handling robot and wherein only a portion of the LEDs in the LED array is illuminated at a particular time;
wherein illumination of the LEDs in the LED array is dependent upon a path of a substrate traveling through the chamber.

2. The substrate handling and heating system of claim 1, wherein the chamber is a transfer chamber.

3. The substrate handling and heating system of claim 2, further comprising a plurality of processing chambers in communication with the transfer chamber, wherein the path of the substrate is from one of the plurality of processing chambers to another of the plurality of processing chambers.

4. The substrate handling and heating system of claim 3, wherein at least one of the plurality of processing chambers comprises a load lock.

5. The substrate handling and heating system of claim 1, wherein the LEDs in the LED array disposed above the substrate are illuminated as the substrate travels through the chamber.

6. The substrate handling and heating system of claim 1, wherein the LEDs emit light at a wavelength absorbed by the substrate.

7. The substrate handling and heating system of claim 6, wherein the wavelength is between 0.4 and 1.0 µm.

8. A substrate handling and heating system, comprising:
a transfer chamber housing, defining a transfer chamber;
a substrate handling robot disposed in the transfer chamber;
a LED array, comprising a plurality of LEDs, disposed in the transfer chamber, wherein the LED array is disposed between a top surface of the transfer chamber housing and the substrate handling robot; and
a controller in communication with the substrate handling robot and the LED array, such that the controller controls movement of the substrate handling robot and controls illumination of the LEDs in the LED array based on a path of a substrate traveling through the transfer chamber via the substrate handling robot, such that only a portion of the LEDs in the LED array is illuminated at a particular time.

9. The substrate handling and heating system of claim 8, wherein the LED array comprises a plurality of zones, wherein each zone can be independently controlled by the controller.

10. The substrate handling and heating system of claim 9, wherein the controller illuminates zones disposed above the substrate and turns off zones not disposed above the substrate as the substrate moves along the path.

11. The substrate handling and heating system of claim 9, wherein each zone comprises one LED.

12. The substrate handling and heating system of claim 9, wherein each zone comprises a plurality of LEDs.

13. The substrate handling and heating system of claim 8, wherein the LEDs emit light at a wavelength between 0.4 and 1.0 µm.

14. A substrate handling and heating system, comprising:
a transfer chamber housing, defining a transfer chamber;

a substrate handling robot disposed in the transfer chamber;

a LED array, comprising a plurality of LEDs, disposed in the transfer chamber, wherein the LED array is disposed between a top surface of the transfer chamber housing and the substrate handling robot;

a substrate handling controller in communication with the substrate handling robot, such that the substrate handling controller controls movement of the substrate handling robot; and a LED array controller in communication with the LED array, such that the LED array controller receives information regarding a position or movement of an arm of the substrate handling robot and controls illumination of the LEDs in the LED array based on a path of a substrate traveling through the transfer chamber via the substrate handling robot.

15. The substrate handling and heating system of claim 14, wherein the substrate handling robot comprises one or more encoders to provide information about the position of the arm of the substrate handling robot, and the LED array controller receives the information from the one or more encoders.

16. The substrate handling and heating system of claim 14, wherein the substrate handling controller provides information to the LED array controller about the position of the arm of the substrate handling robot.

17. The substrate handling and heating system of claim 14, wherein the substrate handling controller provides information to the LED array controller about movement of the arm of the substrate handling robot.

18. The substrate handling and heating system of claim 14, wherein the LED array controller illuminates LEDs disposed above the substrate and turns off LEDs not disposed above the substrate as the substrate moves along the path.

19. The substrate handling and heating system of claim 14, wherein the LEDs emit light at a wavelength between 0.4 and 1.0 μm.

* * * * *